United States Patent
Chen et al.

(10) Patent No.: US 9,526,179 B2
(45) Date of Patent: Dec. 20, 2016

(54) PRINTED CIRCUIT BOARD AND METHOD THEREOF

(71) Applicant: MUTUAL-TEK INDUSTRIES CO., LTD., New Taipei (TW)

(72) Inventors: Chiu Yu Chen, New Taipei (TW); Wen-Chin Lai, New Taipei (TW); Pui-Ren Jiang, New Taipei (TW); Hsu-Tung Chen, New Taipei (TW)

(73) Assignee: MUTUAL-TEK INDUSTRIES CO., LTD., New Taipei (TW)

( * ) Notice: Subject to any disclaimer, the term of this patent is extended or adjusted under 35 U.S.C. 154(b) by 0 days.

(21) Appl. No.: 14/635,952

(22) Filed: Mar. 2, 2015

(65) Prior Publication Data

US 2015/0257267 A1    Sep. 10, 2015

(30) Foreign Application Priority Data

Mar. 6, 2014    (TW) .............................. 103107722 A

(51) Int. Cl.
*H05K 1/00*    (2006.01)
*H05K 3/00*    (2006.01)
*H05K 3/46*    (2006.01)
*H05K 3/20*    (2006.01)

(52) U.S. Cl.
CPC ............ *H05K 3/007* (2013.01); *H05K 3/4691* (2013.01); *H05K 3/20* (2013.01); *H05K 2201/09509* (2013.01); *Y10T 156/1039* (2015.01)

(58) Field of Classification Search
CPC .............. H05K 1/00; H05K 1/02; H05K 1/03; H05K 1/11; H05K 1/18; H05K 3/10; H05K 3/20; H05K 3/38; H05K 3/40; H05K 3/46; H01L 21/56; H01L 21/70; H01L 23/00; H01L 23/12; H01L 23/31; H01L 23/28; H01L 23/48; H01L 23/52

USPC ........ 174/250, 253–256, 259–260, 262, 266; 428/209; 438/118, 127, 128, 244; 442/180; 257/88, 687, 893, 773, 778; 361/761

See application file for complete search history.

(56) References Cited

U.S. PATENT DOCUMENTS

| | | | | |
|---|---|---|---|---|
| 6,419,149 | B1 * | 7/2002 | Yano ..................... | B23K 20/02 228/235.1 |
| 2001/0005545 | A1 * | 6/2001 | Andou .................... | H05K 3/20 428/209 |
| 2001/0030059 | A1 * | 10/2001 | Sugaya .................. | H01L 21/56 174/256 |
| 2002/0045394 | A1 * | 4/2002 | Noda ...................... | B32B 3/10 442/180 |
| 2002/0117743 | A1 * | 8/2002 | Nakatani ............. | H01L 21/4857 257/687 |

(Continued)

FOREIGN PATENT DOCUMENTS

TW    I302080    10/2008
TW    201236519    9/2012

*Primary Examiner* — Xiaoliang Chen
(74) *Attorney, Agent, or Firm* — Liu & Liu

(57) ABSTRACT

A printed circuit board and the method of manufacturing the same are provided. The printed circuit board comprises a supporting plate having a front side and a rear side; a first adhesive layer placed on the front side of the supporting plate; and a front wire layer embedded into the first adhesive layer. The front wire layer includes at least one external contact portion for connecting an electronic component, wherein the surface of the external contact portion is coplanar with the surface of the first adhesive layer surrounding the external contact portion.

7 Claims, 11 Drawing Sheets

(56) References Cited

U.S. PATENT DOCUMENTS

| | | | | |
|---|---|---|---|---|
| 2002/0127379 A1* | 9/2002 | Suzuki | H05K 1/0366 | 428/209 |
| 2002/0155661 A1* | 10/2002 | Massingill | H01L 21/486 | 438/244 |
| 2003/0090883 A1* | 5/2003 | Asahi | H01L 21/6835 | 361/761 |
| 2003/0127725 A1* | 7/2003 | Sugaya | H01L 21/568 | 257/700 |
| 2003/0203171 A1* | 10/2003 | Higashitani | H05K 1/187 | 428/209 |
| 2005/0001331 A1* | 1/2005 | Kojima | H01L 23/3121 | 257/778 |
| 2005/0088833 A1* | 4/2005 | Kikuchi | H01L 23/13 | 361/763 |
| 2005/0118750 A1* | 6/2005 | Baba | H05K 1/187 | 438/128 |
| 2006/0169485 A1* | 8/2006 | Kawaguchi | H05K 3/4691 | 174/254 |
| 2008/0237834 A1* | 10/2008 | Hu | H01L 21/6835 | 257/693 |
| 2008/0264684 A1* | 10/2008 | Kang | H05K 3/205 | 174/262 |
| 2008/0277674 A1* | 11/2008 | Nagai | H01L 33/38 | 257/88 |
| 2009/0038837 A1* | 2/2009 | Okabe | H05K 3/462 | 174/262 |
| 2009/0098478 A1* | 4/2009 | Ryu | H05K 3/4658 | 430/258 |
| 2009/0250253 A1* | 10/2009 | Park | H05K 3/281 | 174/258 |
| 2009/0309231 A1* | 12/2009 | Machida | H01L 21/4857 | 257/773 |
| 2011/0088930 A1* | 4/2011 | Lee | H05K 3/205 | 174/256 |
| 2011/0143501 A1* | 6/2011 | Oda | C08L 63/00 | 438/127 |
| 2012/0012371 A1* | 1/2012 | Kita | H01L 21/4857 | 174/255 |
| 2013/0043063 A1* | 2/2013 | Saito | H05K 3/205 | 174/250 |
| 2015/0024552 A1* | 1/2015 | Su | H01L 24/83 | 438/118 |

\* cited by examiner

PRINTED CIRCUIT BOARD AND METHOD THEREOF

BACKGROUND OF THE INVENTION

Field of the Invention

The present invention relates to a printed circuit board, and more particularly to a printed circuit board including an external contact portion for connecting an electronic component.

Description of the Prior Art

Printed circuit boards are an integral part of modern electronic products. A printed circuit board usually includes a support body, which carries multiple electronic components and wires connecting the multiple electronic components. For a conventional printed circuit board in the earlier days, a wired pattern is formed by a screen printing method, and hence the term "printed circuit board". In most current printed circuit boards, a lithography method is adopted to form a wired pattern by etching or electroplating. The precision that electronic products demand of printed circuit boards increases with the miniaturization of electronic products. Therefore, there is a need for a novel printed circuit board structure and a method for manufacturing the same to satisfy requirements of electronic products.

SUMMARY OF THE INVENTION

The Applicant of the application discovers that, in a conventional printed circuit board manufactured with the prior art, due to insufficient evenness of a contact surface between the printed circuit board and an electronic component, the electronic component mounted thereon is easily swayed such that the performance of an electronic product is undesirably affected. To solve the above and other issues, a printed circuit board and a method for manufacturing the same are provided by the present invention.

A method for manufacturing a printed circuit board is provided according to an embodiment of the present invention. The method includes: providing a carrier board; forming a first wire layer on the carrier board, wherein the first wire layer is embossed on a surface of the carrier and includes at least one external contact portion for connecting an electronic component; providing a substrate and a first adhesive sheet, wherein the first adhesive sheet is placed between the substrate and the carrier board including the first wire layer, and the first wire layer faces the first adhesive sheet; and combining the substrate, the first adhesive sheet, and the carrier board including the first wire layer, wherein the first wire layer is embedded into the first adhesive sheet.

According to another embodiment, in the above method for manufacturing a printed circuit board of the present invention, the carrier board includes: a lower plate; and a flat layer, formed by electroplating and covering the lower plate, wherein the flat layer forms the surface of the carrier board to render the first wire layer to fall thereon.

According to another embodiment, in the above method for manufacturing a printed circuit board of the present invention, the substrate includes: a first conductive layer, a second wire layer, a dielectric layer located between the first conductive layer and the second wire layer, and a cover layer covering the second wire layer, wherein the cover layer faces the first adhesive layer and combines with the carrier board.

According to another embodiment, the above method for manufacturing a printed circuit board of the present invention, after the step of combining the substrate, the first adhesive sheet, and the carrier board including the first wire layer, further includes: converting the first conductive layer to a third wire layer, which is embossed on a surface of the dielectric layer.

According to another embodiment, the above method for manufacturing a printed circuit board of the present invention further includes: forming a fourth wire layer above the third wire layer, wherein the a second adhesive layer is located between the third wire layer and the fourth wire layer, and the fourth wire layer is embossed on a surface of the second adhesive layer.

According to another embodiment, in the above method for manufacturing a printed circuit board of the present invention, the substrate defines a revealed region, the first adhesive sheet includes a first hollow corresponding to the revealed region, and a region of the first wire layer corresponding to the revealed region does not include any wired patterns.

According to another embodiment, in the above method for manufacturing a printed circuit board of the present invention, the substrate defines a revealed region, the second adhesive sheet includes a second hollow corresponding to the revealed region, and a region of the fourth wire layer corresponding to the revealed region does not include any wired patterns to reveal the revealed region of the substrate.

A method for manufacturing a printed circuit board is provided according to another embodiment of the present invention. The method includes: providing a temporary substrate, which includes a first surface and a second surface opposite the first surface; forming one encircle of adhesive coating on each edge of the first surface and the second surface, respectively; providing two carrier boards; adhering the carrier boards on the first surface and the second surface of the temporary substrate via the adhesive coatings, respectively, such that the adhesive coatings do not completely cover the temporary substrate, and gaps exist between the temporary substrate and the carrier boards; and performing the steps on the first surface and the second surface of the temporary substrate as described in the above steps, respectively; and cutting along the adhesive coatings to remove the temporary substrate.

A printed circuit board is provided according to another embodiment of the present invention. The printed circuit board includes: a supporting plate, including a front side and a rear side; a first adhesive layer, placed on the front side of the supporting plate; and a front wire layer, embedded into the first adhesive layer, including at least one external contact portion for connecting an electronic component, wherein a surface of the external contact portion is coplanar with a surface of the first adhesive layer that surrounds the external contact portion.

According to another embodiment, the above printed circuit board of the present invention further includes: a second adhesive layer, placed on the rear side of the supporting plate; and a rear wire layer, placed on the second adhesive layer, embossed on a surface of the second adhesive layer.

According to another embodiment, in the above printed circuit board of the present invention, the supporting plate includes: an upper inner wire layer, being adjacent to the rear wire layer; a lower inner wire layer, being adjacent to the front wire layer; and a dielectric layer, located between the upper inner wire layer and the lower inner wire layer, wherein the supporting plate does not include any conductive hole that conducts only the lower inner wire layer and the front wire layer.

According to another embodiment, in the above printed circuit board of the present invention, the supporting plate defines a revealed region, the first adhesive layer includes a first hollow corresponding to the revealed region, and a region of the front wire layer corresponding to the revealed region does not include any wired patterns to thus reveal the revealed region of the substrate.

According to another embodiment, in the above printed circuit board of the present invention, the supporting plate defines a revealed region, the second adhesive layer includes a second hollow corresponding to the revealed region, and a region of the rear wire layer corresponding to the revealed region does not include any wired patterns to thus reveal the revealed region of the substrate.

Other aspects of the present invention for solving other issues and the above aspects are disclosed in detail in the embodiments below.

DETAILED DESCRIPTION OF THE EMBODIMENTS

Figure 1:
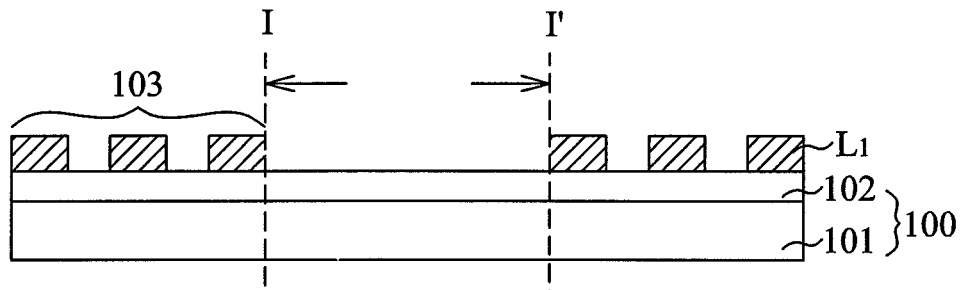
FIG. 1 to FIG. 7 are sectional views illustrating a manufacturing process of a printed circuit board according to a first embodiment of the present invention.

Preferred embodiments of the present invention are described in detail below with reference to the accompanying drawings. Similar elements in the drawings are assigned with similar element denotations. It should be noted that, to clearly present the present invention, the elements in the drawings are not drawn to scale. Further, to prevent diversions from the technical contents of the present invention, details associated with known components, materials and processing techniques of the prior art are omitted in the description below.

FIG. 1 to FIG. 7 illustrate a manufacturing process of a printed circuit board 700 according to a first embodiment of the present invention. Referring to FIG. 1, a carrier board 100 is provided, and a first wire layer L1 is formed thereon. In addition to a supporting function, the carrier board 100 also provides a function of a flat surface. Further, the carrier board 100 is for temporary use only, and will be removed in a later process to be eliminated from a final product of the printed circuit board. In the embodiment, the carrier board 100 includes a lower plate 101 and a flat layer 102. The lower plate 101 may be made of copper or other suitable material. The flat layer 102 is made of electroplated tin or other suitable material, and forms a surface of the carrier board 100. The carrier board 100 defines a revealed region, as shown by a region represented by dotted lines I-I' in FIG. 1. Next, the first wire layer L1 is formed on the carrier board 100, and is embossed on the surface of the flat layer 102 (i.e., on the surface of the carrier board 100). The first wire layer L1 may be formed by a conventional technique, e.g., utilizing a patterned photoresist as a mask. Wires then are formed on the surface of the flat layer 102, and the photoresist is removed. The first wire layer L1 in the revealed region does not include any wired patterns. Further, the first wire layer L1 includes at least one external contact portion 103 for connecting an electronic component (not shown).

Figure 2:
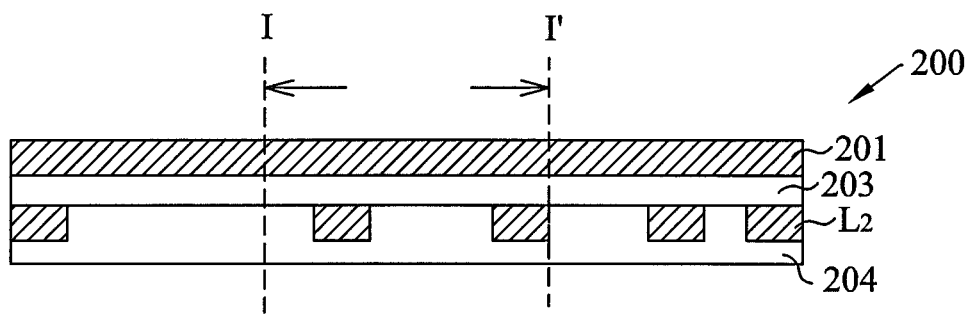

Referring to FIG. 2, a substrate 200 is provided. When the carrier board 100 is removed in a later process, the substrate 200 may be utilized to support the first wire layer L1. The substrate 200 may include or exclude wires. In the embodiment, the substrate 200 also defines the revealed region corresponding to the carrier board 100, as the region represented by the dotted lines I-I' in FIG. 2. In the embodiment, the substrate 200 includes a first conductive layer 201, a second wire layer L2, a dielectric layer 203 located between the first conductive layer 201 and the second wire layer L2, and a cover layer 204 covering the second wire layer L2. The second wire layer L2 in the revealed region includes a wired pattern. The first conductive layer 201 and the second wire layer L2 may be made of copper or other suitable material. The dielectric layer 203 and the cover layer 204 may be made of any other suitable insulation material, e.g., a flexible insulation material such as polyimide added with epoxy.

Figure 3:
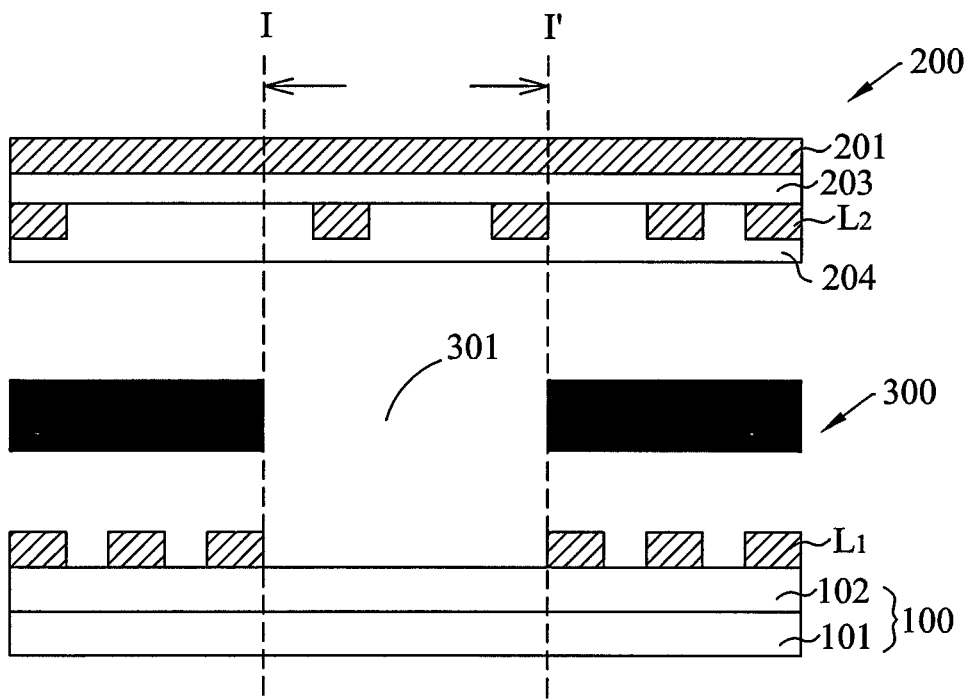
Figure 4:
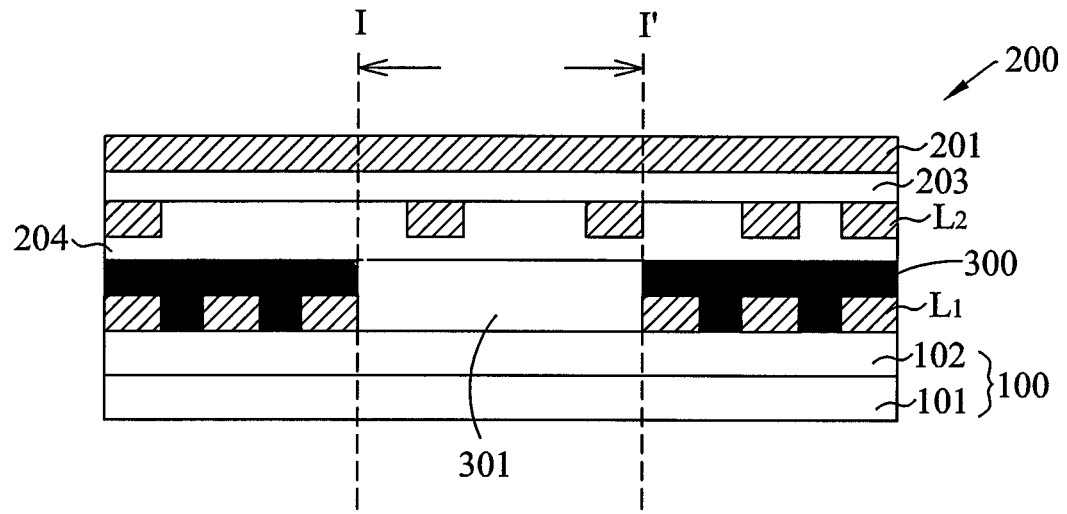

Referring to FIG. 3, a first adhesive sheet 300 is provided and placed between the substrate 200 and the carrier board 100 having the first wire layer L1. The first wire layer L1 faces the first adhesive sheet 300. The cover layer 204 of the substrate 200 faces the first adhesive sheet 300. In the embodiment, the first adhesive sheet 300 includes a first hollow 301 corresponding to the foregoing revealed region. The substrate 200, the first adhesive sheet 300, and the carrier board 100 having the first wire layer L1 are combined by thermal pressing. After the combining step, the first wire layer L1 is embedded into the first adhesive sheet 300, as shown in FIG. 4. The first adhesive sheet 300 may be a pre-impregnated (pre-preg) composite material made of a fiber fabric dipped in epoxy as applied in a common circuit board manufacturing process, or other suitable material.

Figure 5:
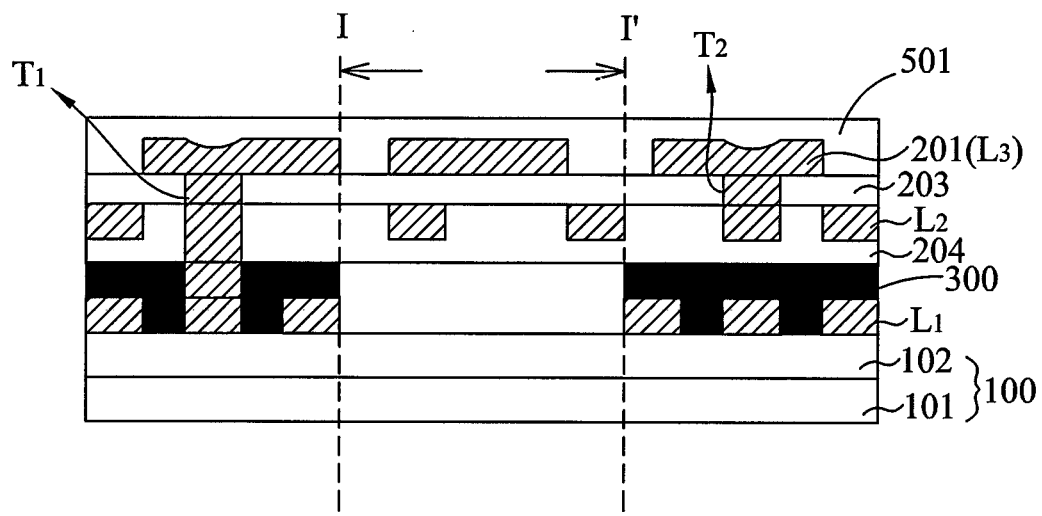

After completing the above combining step, one or more wire layers may be optionally formed on the substrate 200. Alternatively, a plated copper drilling process may be performed to conduct the wires among the layers. In the embodiment, as shown in FIG. 5, laser drilling or blind-hole copper plating may be first performed to form conductive holes T1 and T2 shown in the diagram. Next, a third wire layer L3 is formed on the dielectric layer 203. The third layer L3 is formed by converting the first conductive layer 201 by patterned etching, and is thus embossed on the surface of the dielectric layer 203. The third wire layer L3 in the revealed region may optionally include or exclude wires. In the embodiment, an example of the third wire layer L3 in the revealed region having wires is given for illustrations. The conductive hole T1 directly conducts the first wire layer L1 and the third wire layer L3. That is, although the conductive hole T1 penetrates through the second wire layer L2, the conductive hole T1 does not electrically conduct the second wire layer L2. The conductive hole T2 conducts the second wire layer L2 and the third wire layer L3. As the plated copper drilling process is performed at the first conductive layer 201 (i.e., the third wire layer L3), a conductive hole that conducts only the first wire layer L1 and the second wire layer L2 is not formed. After completing the third wire layer L3, a protection layer 501 is applied to cover the third wire layer L3. The protection layer 501 may be made of a material same as that of the cover layer 204, or other suitable material.

Figure 6:
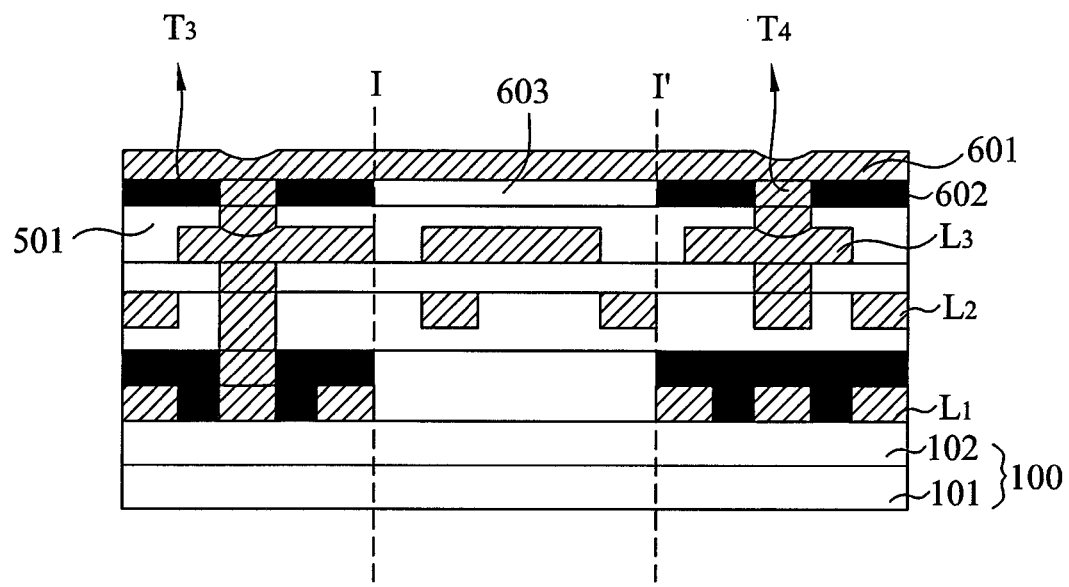
Figure 7:
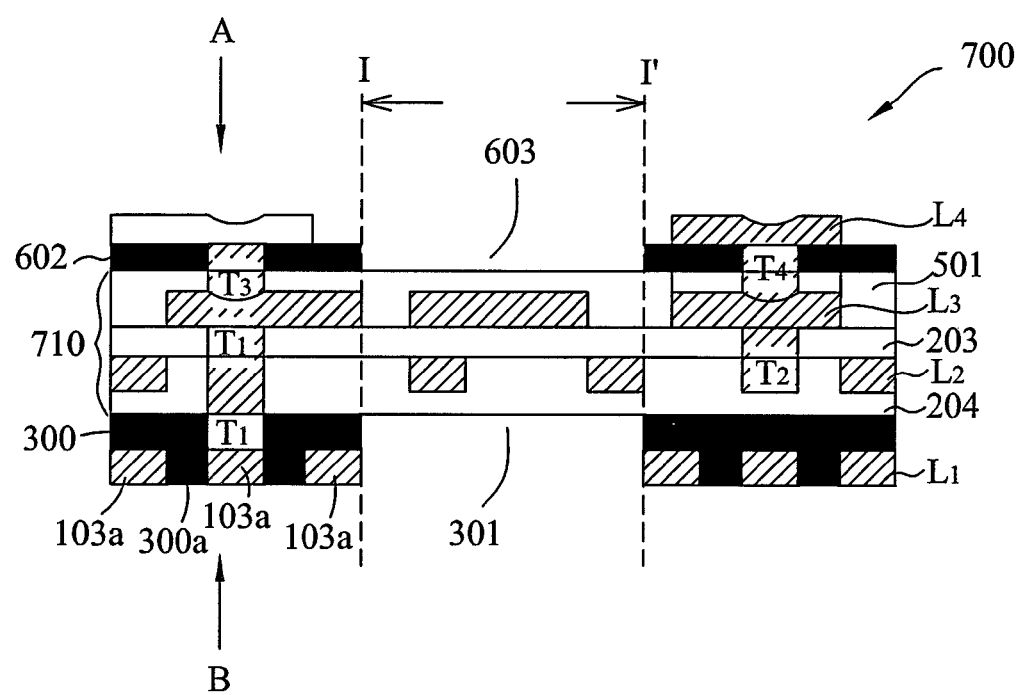

Referring to FIG. 6 and FIG. 7, a second conductive layer 601 is formed above the third wire layer L3, a plated copper drilling process is performed, the carrier board 100 is removed to reveal the first wire layer L1, and the second conductive layer 601 is converted to a fourth wire layer L4. Known printed circuit board techniques may be utilized to perform the above steps. More specifically, as shown in FIG. 6, a copper sheet (serving as the second conductive layer 601) is provided, and a second adhesive sheet 602 is placed between the copper sheet and the third wire layer L3. The second adhesive sheet 62 includes a second hollow 603 corresponding to the revealed region. The second adhesive sheet 602 may be made of material same as that of the first adhesive sheet 300. By thermal pressing, the structure formed in FIG. 5, the second adhesive sheet 602 and the copper sheet (i.e., the second conductive layer 601) are combined. Next, a plated copper drilling process is performed to form conductive holes T3 and T4. Referring to FIG. 7, after the plated copper drilling process, etching is performed to remove the carrier board 100. Meanwhile, etching is also utilized to pattern the second conductive layer 601 to convert the second conductive layer 601 to the fourth wire layer L4. In the embodiment, the fourth wire layer L4 is embossed on the surface of the second adhesive sheet 602. The region of the fourth wire layer L4 corresponding to the revealed region does not include any wired pattern.

FIG. 7 shows a printed circuit board 700 manufactured by the method according to the first embodiment of the present invention. As shown, the printed circuit board 700 includes a supporting plate 710. The supporting plate 710 defines a front side B and a rear side A. The supporting plate 710 includes an upper inner wire layer L3 (i.e., the third wire layer L3), a lower inner wire layer (i.e., the second wire layer L2), and a dielectric layer 203 arranged between the upper inner wire layer L3 and the lower inner wire layer L2. The printed circuit board 700 further includes a first adhesive layer 300 (i.e., the first adhesive sheet) placed on the front side B of the supporting plate 710, a front wire layer L1 (i.e., the first wire layer) embedded into the first adhesive layer 300, a second adhesive layer 602 (i.e., the second adhesive sheet) placed on the rear side A of the supporting plate 710, and a rear wire layer L4 (i.e., the fourth wire layer) placed on the second adhesive layer 602. The rear wire layer L4 is embossed on a surface of the second adhesive layer 602. The front wire layer L1 includes at least one external contact portion 103 for connecting an electronic component (not shown). It should be noted that, a surface 103a of the external contact portion 103 and a surface 300a of the first adhesive layer 300 that surrounds the external contact portion 103 have a substantially coplanar feature. Thus, when adhering the electronic component to the surface 103a of the external contact portion 103, the above substantially coplanar feature provides the surface for adhesion with sufficient flatness, thereby overcoming the issue of a swaying electronic component thereon. It should further noted that, compared to a coplanar flat surface formed by the front wire layer L1 and the first adhesive layer 300, a surface formed by the rear wire layer L4 and the second adhesive layer 602 is quite uneven. In addition to differences resulted by the rear wire layer L4 embossed on the surface of the second adhesive layer 602, reasons accounting for the unevenness further include a bumpy surface of the rear wire layer L4 formed by layer stacking and the plated copper drilling process in the manufacturing process. Although the unevenness of the surface of the rear wire layer L4 is not distinctly depicted in the drawing, one skilled person in the art can easily understand associated details in practice.

Also referring to FIG. 7, the supporting plate 710 further includes a conductive hole T1 (communicating the front wire layer L1, the lower inner wire layer L2 and the upper inner wire layer L3), a conductive hole T2 (communicating the lower inner wire layer L2 and the upper inner wire layer L3), a conductive hole T3 (communicating the upper inner wire layer L3 and the rear wire layer L4), and a conductive hole T4 (communicating the upper inner wire layer L3 and the rear wire layer L4). The supporting plate 710 does not include any conductive hole that communicates only the front wire layer L1 and the lower inner layer L2. The supporting plate 710 defines a revealed region, as shown by a region represented by dotted lines I-I' in the diagram. The first adhesive layer 300 includes a first hollow 301 corresponding to the revealed region. A region of the front wire layer L1 corresponding to the revealed region does not include any wired patterns to thus reveal the revealed region of the supporting plate 710. The second adhesive layer 602 includes a second hollow 603 corresponding to the revealed region. A region of the rear wire layer L4 corresponding to the revealed region does not include any wired patterns.

Figure 8A:
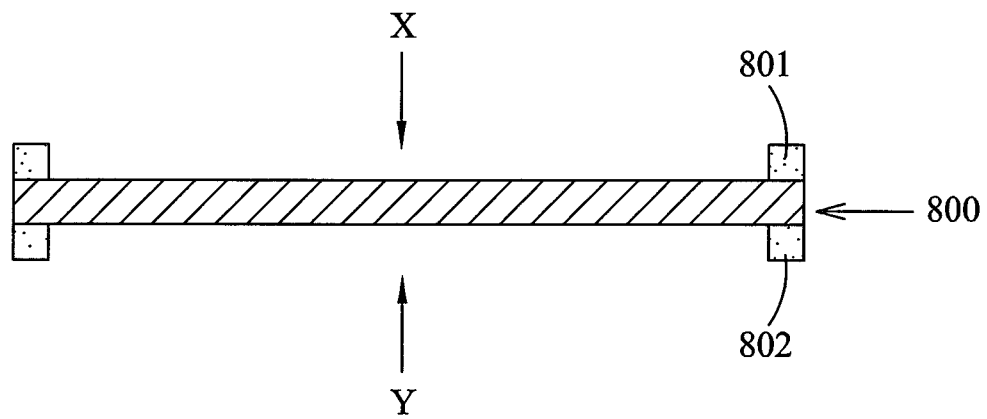
FIG. 8A, FIG. 9 and FIG. 10 are sectional views illustrating a manufacturing process of a printed circuit board according to a second embodiment of the present invention.
Figure 8B:
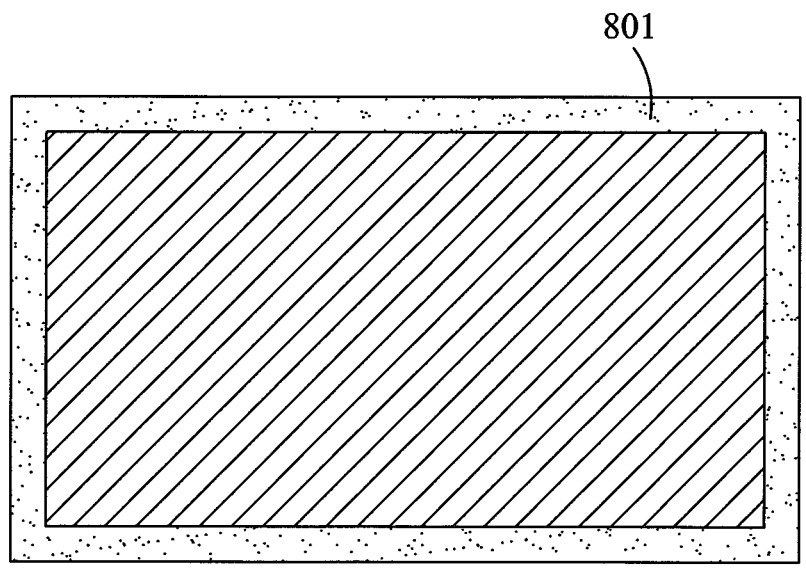
FIG. 8B is a top view corresponding to the sectional view in FIG. 8A.

FIG. 8A, FIG. 8B, FIG. 9 and FIG. 10 illustrate another manufacturing process of the printed circuit board 700 according to a second embodiment of the present invention. Referring to FIG. 8A and FIG. 8B, the manufacturing process of the second embodiment first includes providing a temporary substrate 800 including a first surface X and a second surface Y opposite the first surface X. The temporary substrate 800 may be made of any other suitable material, e.g., a common double-sided copper substrate board. Next, the adhesive coatings 801 and 802 are respectively applied to each edge of the first surface X and the second surface Y. FIG. 8B shows a top view corresponding to the sectional view in FIG. 8A. In FIG. 8B, a pattern of the adhesive coating 801 is an encircling rectangle. In addition to a rectangle, the pattern of the adhesive coating 801 may be a circle or other appropriate patterns. The adhesive coating may be a pre-impregnated (pre-preg) composite material made of a fiber fabric dipped in epoxy as applied in a common circuit board manufacturing process, or other suitable material.

Figure 9:
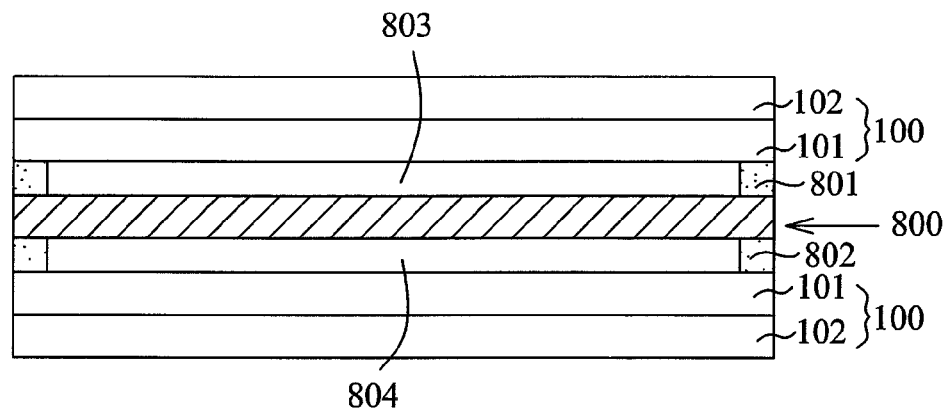
Figure 10:
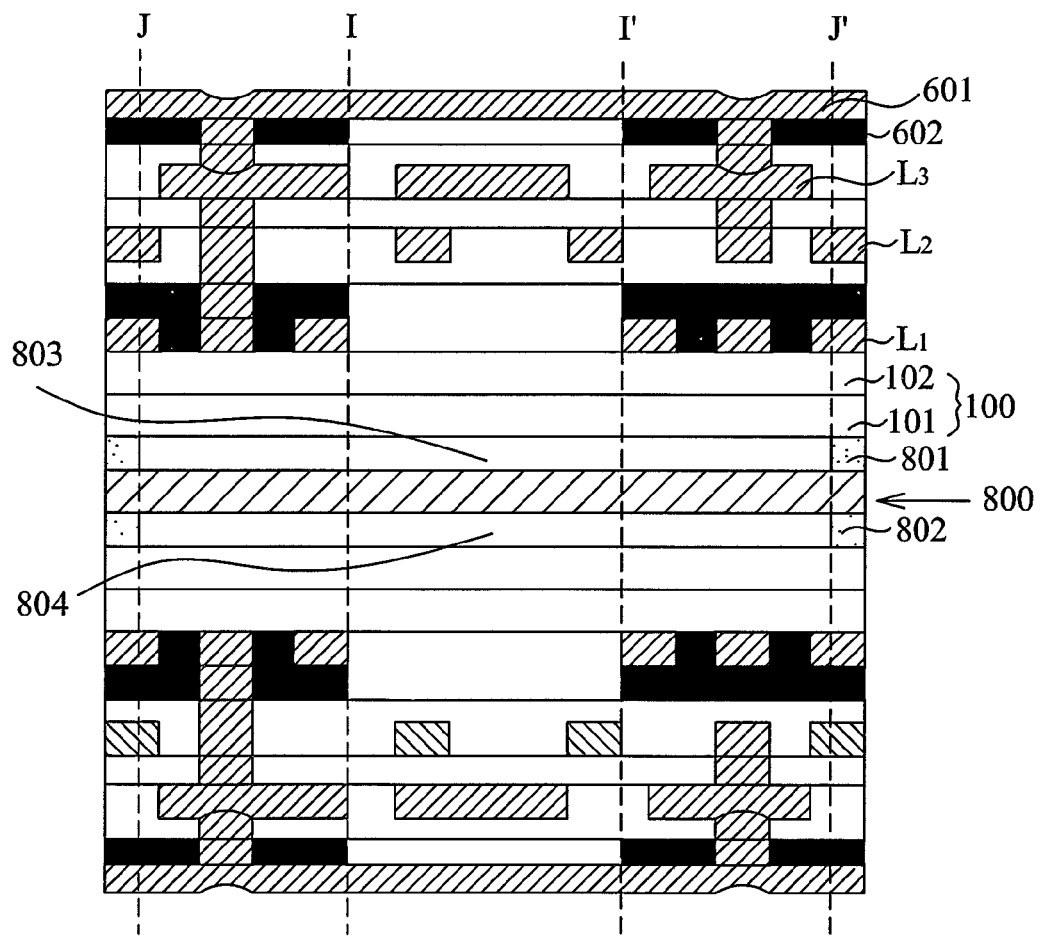

Referring to FIG. 9, via the adhesive coatings 801 and 802, two pieces of the carrier board 100 in the first embodiment are adhered to the first surface X and the second surface Y of the temporary substrate 800, respectively. It should be noted that, as the adhesive coating 801 does not completely cover the temporary substrate 800, between the temporary substrate 800 and the carrier boards 100 are gaps 803 and 804. Referring to FIG. 10, the steps shown in FIG. 1 to FIG. 6 according to the first embodiment are respectively performed on the first surface X and the second surface Y of the temporary substrate 800 to form two sets of printed circuit board shown in FIG. 6 as structures respectively located at two sides of the temporary substrate 800. Along dotted lines J, J' in FIG. 10, inner edges (or referring to inner edges of the adhesive coating 801 in FIG. 8B) of the adhesive coatings 801 and 802 are cut. After cutting, the adhesive coatings 801 and 802 are disengaged. With the gaps 803 and 804, the temporary substrate 800 can be easily separated from upper and lower carrier boards 100. Therefore, with the above method, two sets of printed circuit boards shown in FIG. 6 can be formed within one manufacturing process. The subsequent steps described in the first embodiment are performed on the printed circuit boards to obtain two sets of printed circuit boards 700.

Figure 11:
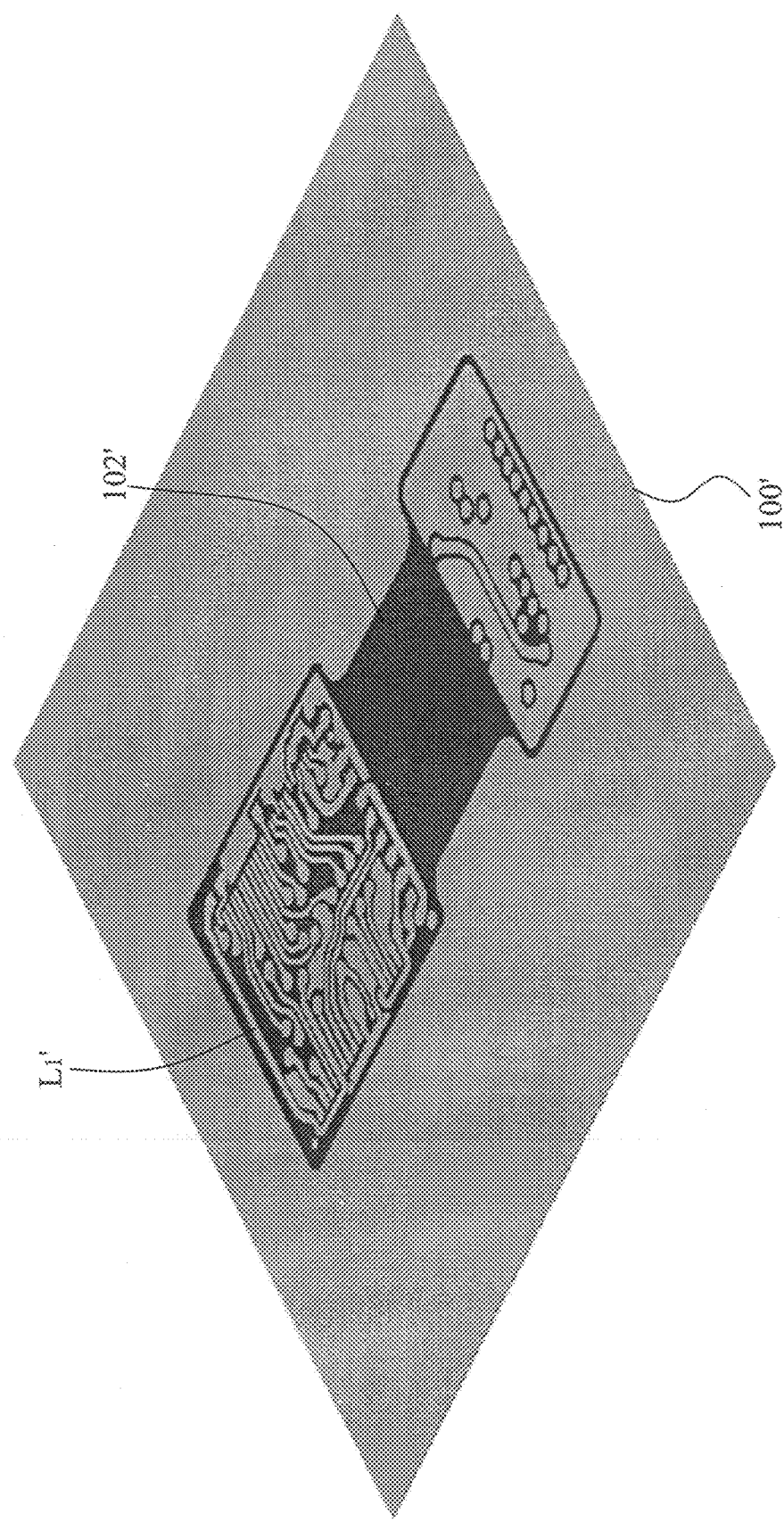
FIG. 11 to FIG. 16 are top views illustrating a manufacturing process of a printed circuit board according to a third embodiment of the present invention.

FIG. 11 shows a top view of a carrier board 100' and a first wire layer L1' according to a third embodiment of the present invention. FIG. 11 may be referred together with FIG. 1 of the first embodiment.

Figure 12:
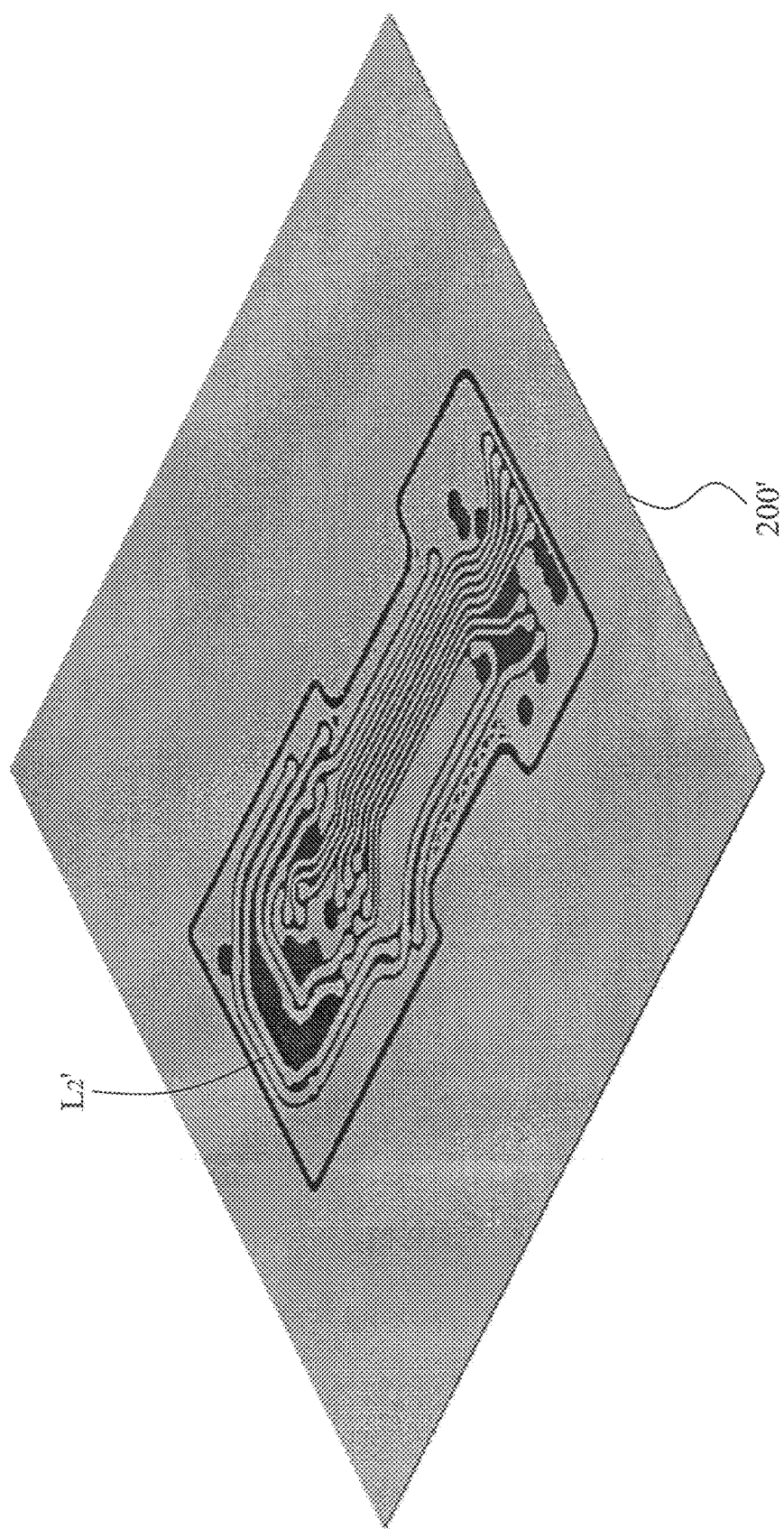

FIG. 12 shows a top view of a substrate 200' including a second wire layer L2' according to the third embodiment of the present invention. FIG. 12 may be referred together with FIG. 2 of the first embodiment.

Figure 13:
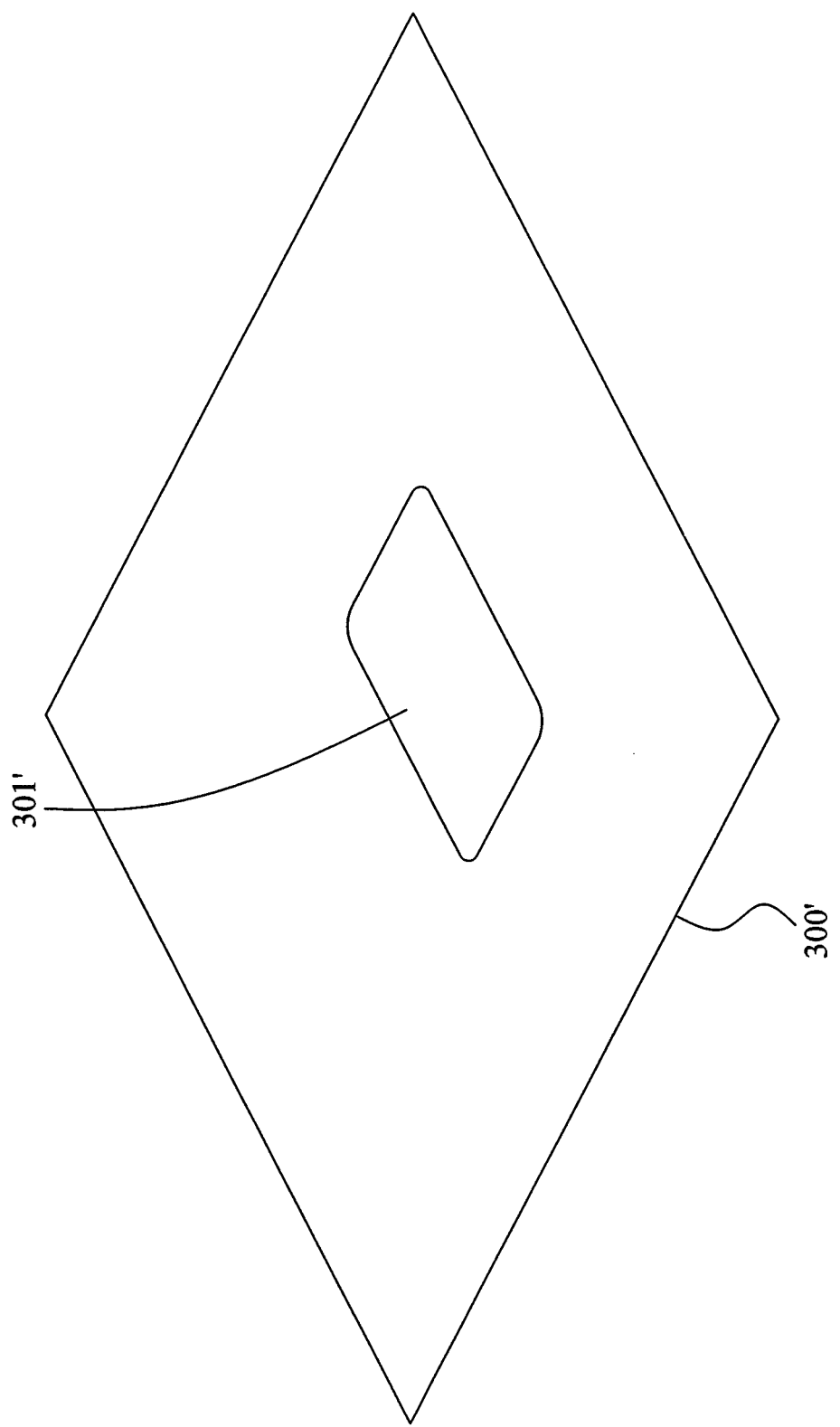

FIG. 13 shows a top view of a first adhesive sheet 300' having a first hollow 301' according to the third embodiment of the present invention. FIG. 13 may be referred together with FIG. 3 of the first embodiment.

Figure 14:
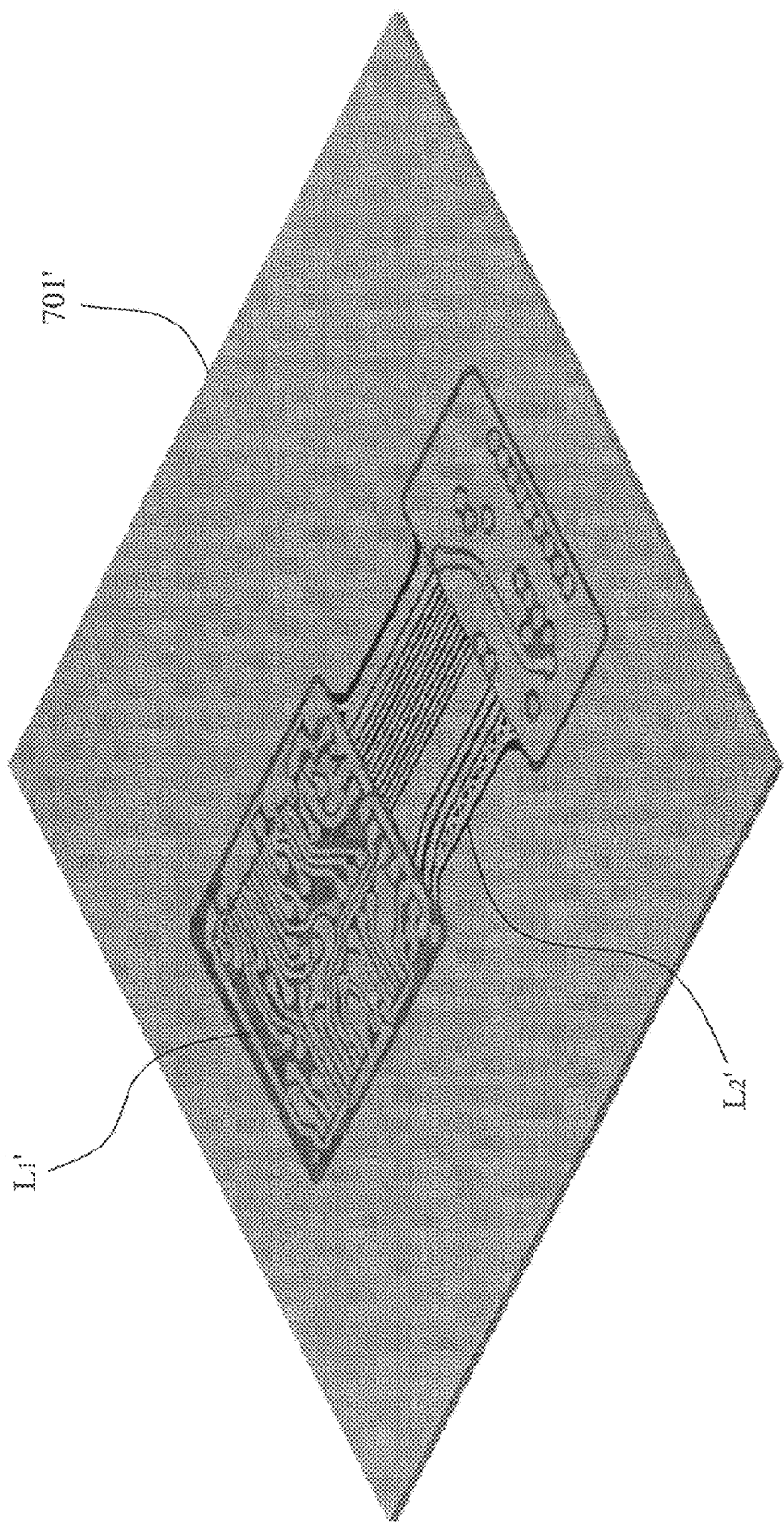

FIG. 14 is a top view of a supporting plate 710' including a front wire layer L1' according to the third embodiment of the present invention. FIG. 14 may be referred together with FIG. 7 of the first embodiment.

Figure 15:
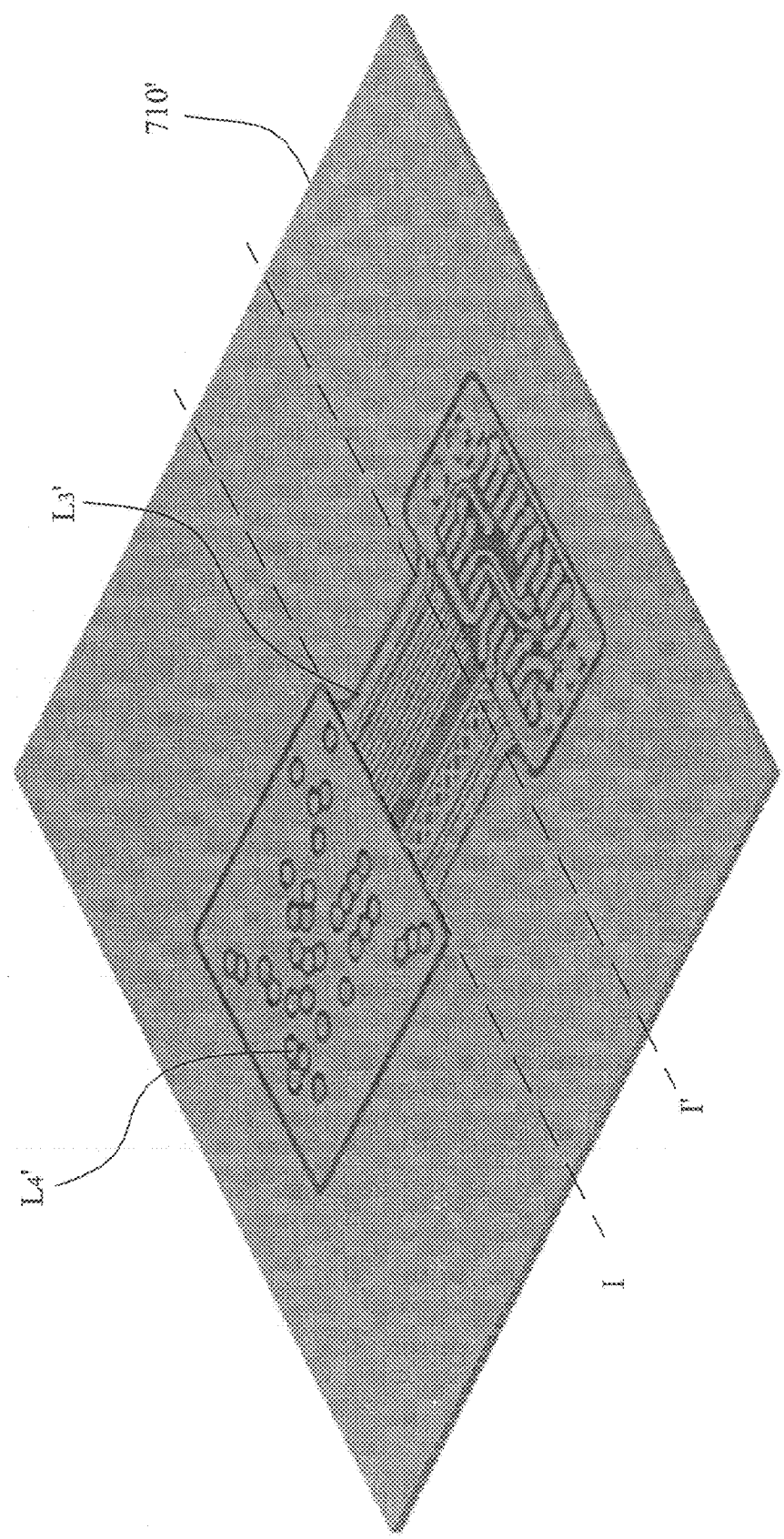

FIG. 15 shows a top view of the supporting plate 710' including a rear wire layer L4' according to the third embodiment of the present invention. FIG. 15 may be referred together with FIG. 7 of the first embodiment.

Figure 16:
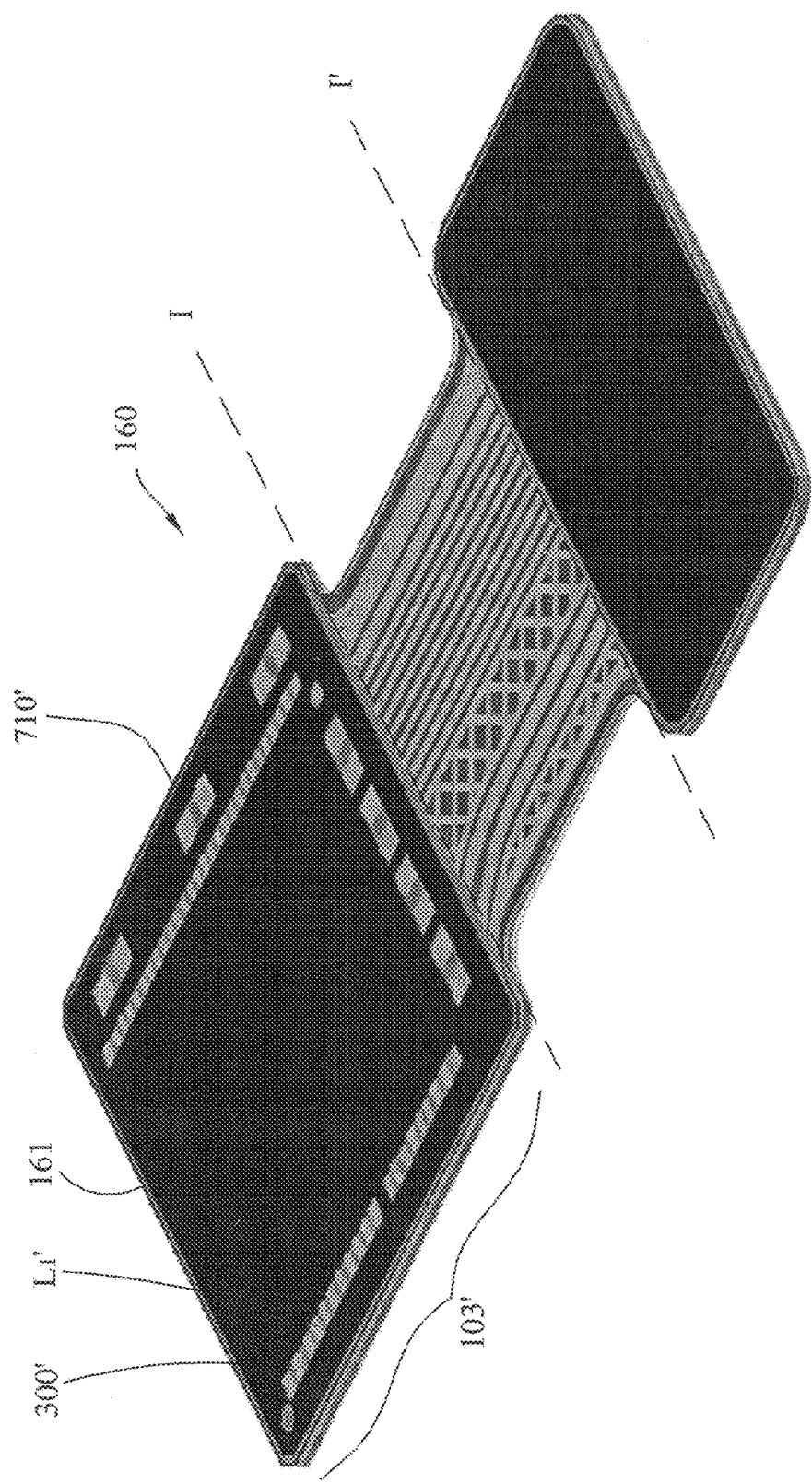

FIG. 16 shows a schematic diagram of a printed circuit board product unit 160 according to the third embodiment of the present invention. In FIG. 16, the product unit 160 formed by applying a solder resist layer 161 on the printed circuit board in FIG. 14 and FIG. 15 and performing unit cutting. As shown, an appearance of the product unit 160 includes a revealed region of the supporting plate 710', and an external contact portion 103' of the front wire layer L1' embedded into the first adhesive layer 300'. The external contact portion 103' is for connecting an electronic component (not shown). A surface of the external contact portion 103' is coplanar with a surface of the first adhesive layer 300' that surrounds the external contact portion 103'.

While the invention has been described in terms of what is considered to be preferred embodiments, it is to be understood that the embodiments are only illustrative and are not to be construed as limitations to the invention. It should be noted that, without departing from the spirit of the invention, equivalent variations and modifications made to the embodiments are within the scope of the appended claims.

What is claimed is:

1. A method for manufacturing a printed circuit board, comprising:
   providing a carrier board;
   forming a first wire layer on the carrier board, wherein the first wire layer is embossed on a surface of the carrier board and comprises at least one external contact portion for connecting an electronic component;
   providing a substrate and a first adhesive sheet, wherein the first adhesive sheet is placed between the substrate and the carrier board comprising the first wire layer, and the first wire layer faces the first adhesive sheet, wherein the substrate comprises:
      a first conductive layer, a second wire layer, a dielectric layer located between the first conductive layer and the second wire layer, and a cover layer covering the second wire layer, wherein the cover layer faces the first adhesive sheet and combines with the carrier board; and
   combining the substrate, the first adhesive sheet, and the carrier board including the first wire layer, wherein the first wire layer is embedded into the first adhesive sheet.

2. The method according to claim 1, wherein the carrier board comprises:
   a lower plate; and
   a flat layer, formed by electroplating and covering the lower plate, wherein the flat layer forms a surface of the carrier board to render the first wire layer to locate thereon.

3. The method according to claim 1, after the step of combining the substrate, the first adhesive sheet, and the carrier board comprising the first wire layer, further comprising:
   converting the first conductive layer to a third wire layer, which is embossed on a surface of the dielectric layer.

4. The method according to claim 3, further comprising:
   forming a fourth wire layer above the third wire layer, wherein a second adhesive sheet is located between the third wire layer and the fourth wire layer, and the fourth wire layer is embossed on a surface of the second adhesive sheet.

5. The method according to claim 4, wherein the substrate defines a revealed region, the second adhesive sheet comprises a second hollow corresponding to the revealed region, and a region of the fourth wire layer corresponding to the revealed region does not comprise any wired pattern.

6. A method for manufacturing a printed circuit board, comprising:
   providing a carrier board;
   forming a first wire layer on the carrier board, wherein the first wire layer is embossed on a surface of the carrier board and comprises at least one external contact portion for connecting an electronic component;
   providing a substrate and a first adhesive sheet, wherein the first adhesive sheet is placed between the substrate and the carrier board comprising the first wire layer, and the first wire layer faces the first adhesive sheet; and
   combining the substrate, the first adhesive sheet, and the carrier board including the first wire layer, wherein the first wire layer is embedded into the first adhesive sheet, wherein the substrate defines a revealed region, the first adhesive sheet comprises a first hollow corresponding to the revealed region, and a region of the first wire layer corresponding to the revealed region does not comprise any wired pattern.

7. A method for manufacturing a printed circuit board, comprising:
   providing a carrier board;
   forming a first wire layer on the carrier board, wherein the first wire layer is embossed on a surface of the carrier board and comprises at least one external contact portion for connecting an electronic component;
   providing a substrate and a first adhesive sheet, wherein the first adhesive sheet is placed between the substrate and the carrier board comprising the first wire layer, and the first wire layer faces the first adhesive sheet; and
   combining the substrate, the first adhesive sheet, and the carrier board including the first wire layer, wherein the first wire layer is embedded into the first adhesive sheet, wherein prior to the step of forming the first wire layer, the method further comprises:
   providing a temporary substrate, including a first surface and a second surface opposite the first surface;
   forming one encircle of adhesive coating respectively on each edge of the first surface and the second surface;
   providing two pieces of the carrier boards; and
   adhering the carrier boards on the first surface and the second surface of the temporary substrate via the adhesive coatings, respectively, such that the adhesive coatings do not completely cover the temporary substrate and gaps exist between the temporary substrate and the carrier boards; and wherein after the step of combining the substrate, the first adhesive sheet, and the carrier, board, the method further comprises:

cutting along the adhesive coatings to remove the temporary substrate.

\* \* \* \* \*